(12) United States Patent
Nakamuta et al.

(10) Patent No.: US 7,664,217 B2
(45) Date of Patent: Feb. 16, 2010

(54) DIGITAL PLL CIRCUIT

(75) Inventors: Koji Nakamuta, Kawasaki (JP); Yoshito Koyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 495 days.

(21) Appl. No.: 11/149,290

(22) Filed: Jun. 10, 2005

(65) Prior Publication Data
US 2006/0171496 A1 Aug. 3, 2006

(30) Foreign Application Priority Data
Feb. 3, 2005 (JP) ............................. 2005-027231

(51) Int. Cl.
*H03D 3/24* (2006.01)
(52) U.S. Cl. .................. 375/376; 375/294; 375/354; 375/327; 327/141; 331/18; 331/40; 331/44; 455/260
(58) Field of Classification Search .............. 375/376, 375/294, 215
See application file for complete search history.

(56) References Cited
U.S. PATENT DOCUMENTS
4,553,128 A * 11/1985 Pilost .......................... 341/161

| | | | | |
|---|---|---|---|---|
| 6,072,842 A * | 6/2000 | Janesch et al. | ............... | 375/326 |
| 6,687,841 B1 * | 2/2004 | Marukawa | ................... | 713/500 |
| 6,801,093 B2 | 10/2004 | Kuwajima | | |
| 6,968,027 B2 * | 11/2005 | Fukuhara | ..................... | 375/376 |
| 2002/0190764 A1 * | 12/2002 | Nichols | ....................... | 327/156 |

FOREIGN PATENT DOCUMENTS
JP 2002-353807 A 12/2002

* cited by examiner

*Primary Examiner*—Shuwang Liu
*Assistant Examiner*—Lihong Yu
(74) *Attorney, Agent, or Firm*—Fujitsu Patent Center

(57) ABSTRACT

A DPLL circuit is provided for making it possible to inhibit an initial frequency offset during holdover. The DPLL circuit includes a slave oscillator for generating a frequency signal corresponding to the size of a control signal value; a phase difference detection circuit for detecting the difference in phase between the output of said slave oscillator and the inputted reference clock, and outputting a digital signal of the prescribed number of bits corresponding to said detected phase difference; and a holdover unit for generating a correction value based on the output of said phase difference detection circuit, wherein when the holdover is detected, said holdover unit periodically adds the correction value to the output of said phase difference detection circuit to obtain a control value for said slave oscillator.

3 Claims, 11 Drawing Sheets

DIGITAL PLL CIRCUIT

BACKGROUND OF THE INVENTION

1. Field of the Invention

The present invention relates to a digital PLL (referred to hereinbelow as DPLL) circuit, and more particularly to a DPLL circuit in a synchronization circuit unit for generating a reference clock source to be used in transmission devices (optical transmission devices, mobile communication devices, and the like) located in digital synchronization networks.

2. Description of the Related Art

Clock sources serving as a reference are the most significant components of digital synchronization networks, and cesium atomic oscillators as primary standard are generally used therein. Transmission devices in a synchronization network comprise a synchronization circuit unit for generating clock signals to be used in the devices based on the clocks distributed from the reference clock source.

Characteristics of clock signals generated by the synchronization circuit units are specified in detail for each subordinate hierarchical level (stratum) in the synchronization network by ITU810, GR-1244 (Bellcore). A state in which autonomous operation is initiated by a frequency drift immediately prior to fault generation at the time of reference clock fault generation and the operation is conducted at an accuracy of a slave oscillator is called "holdover" and frequency accuracy during such holdover is also specified as one of those characteristics.

Here, a DPLL (Digital Phase Lock Loop) circuit used for synchronizing a clock signal used in the device with the inputted reference clock signal in the synchronization circuit unit will be explained below in a simple manner.

FIG. 1 is a block diagram illustrating a general configuration example of a DPLL circuit. Referring to FIG. 1, a section 100 surrounded by a solid line is the DPLL circuit. A synchronization network clock signal from a digital synchronization network is divided by N with a 1/N divider 102 and inputted as a reference clock signal (REF_CLK).

In the DPLL circuit 100, a digital phase comparator (DPD) 1 outputs a count value corresponding to the phase difference between the reference clock signal (REF_CLK) and a feedback clock (FB_CLK).

FIG. 2 illustrates the comparison operation of the digital phase comparator (DPD) 1. In FIG. 2, (A) is the reference clock signal (REF_CLK) and (B) is the feedback signal (FB_CLK). A clock signal from an internal high-accuracy oscillator 2 is inputted into the digital phase comparator (DPD) 1 via an analog PLL circuit 3.

The digital phase comparator (DPD) 1 comprises a counter and initiates the counter of output clocks of the analog PLL circuit 3 at the rising edge of the reference clock signal (REF_CLK) (A). Then, the count of the counter is terminated at the falling edge of the feedback signal (FB_CLK) (B). As a result, the digital phase comparator (DPD) 1 counts the number of output clocks of the analog PLL circuit 3 in the period corresponding to a phase difference between the reference clock signal (REF_CLK) and feedback signal (FB_CLK) and outputs the counter count value corresponding to this phase difference.

Returning to FIG. 1, the counter clock value corresponding to the phase difference from the digital phase comparator (DPD) 1 is inputted as a phase error signal into the digital loop filter (DLF) 4. The digital loop filter (DLF) 4 integrates the counter count value and averages the inputted phase error signal.

Then, the error average value obtained in the digital loop filter (DLF) 4 is converted into an analog signal by the D/A converter 5 and inputted into a voltage control oscillator (VCO) 6 which is a slave oscillator. Therefore, the voltage control oscillator 6 outputs the signal of the frequency corresponding to the input analog voltage as an internal clock of a transmission device. At the same time, a frequency of the frequency signal is divided into 1/N by the 1/N divider 7 and feedback returned as a feedback signal (FB_CLK) to the digital phase comparator (DPD) 1. Therefore, the oscillation frequency of the slave oscillator is controlled so as to be synchronized with the reference clock (REF_CLK).

FIG. 3 relates to the case where a direct digital synthesizer (DDS) is used for a slave oscillator. Components identical to those shown in FIG. 1 are assigned with the same reference numerals.

The direct digital synthesizer (DDS) 8 is a circuit for synthesizing, by means of digital data, and creating an oscillation waveform to be outputted by employing a clock generated by a fixed oscillator 2 with a high internal accuracy as a source. In the example shown in FIG. 3, the output from the digital filter 4 is equivalent to the digital data.

In a DPLL circuit 100 shown in FIG. 1 and FIG. 3, the set resolution of the output frequency depends on the bit width of the D/A converter 5 or direct digital synthesizer 8 and shows discrete changes with respect to time T, as shown in FIG. 4, but as an average frequency drift, it assumes a value close to ±0.

However, within the framework of the conventional technology illustrated by FIG. 1 and FIG. 3, the control voltage (digital data when the direct digital synthesizer (DDS) 8 shown in FIG. 3 is used) of the slave oscillator during the holdover assumes a fixed value. This fixed value is determined based on the information at the time of reference clock synchronization.

This determination can be conducted in a simple manner by a method employing a voltage (data) immediately preceding the generation of fault in the reference signal or a method by which the feedback data during synchronization are accumulated in a buffer, and when a fault is detected, the average value of the accumulated data is computed.

The invention described in Japanese Patent Application Laid-open No. 2002-353807 is known as an example of the conventional technology. This invention was created to resolve the following problem: when the reference clock was degraded, the voltage value of the voltage control oscillator was reset to the value during synchronization, the holdover state was not assumed and the synchronization clock matched the fluctuating reference signal. With this invention, the control voltage value for control in synchronization with the reference clock is written into a memory and the range of the control voltage corresponding to the preset frequency control range is corrected based on the control voltage value.

SUMMARY OF THE INVENTION

However, with any of the above-described methods, because the data is a fixed value, the initial set accuracy depends on the set resolution (bit width) of the D/A converter 5 (FIG. 1) or direct digital synthesizer 8 (FIG. 3).

FIG. 5 illustrates the state of frequency drift during the holdover. The frequency drift is plotted against the ordinate and the time is plotted against the abscissa. The instant T of time is taken as a reference, the time prior to this instant represents the in-phase state, and the holdover state is assumed at the instant T.

The upper right section of FIG. 5 shows an enlarged view of the holdover characteristic at the instant T of time. At the instant T, the autonomous operation is initiated at the frequency drift (FD) and thereafter the operation proceeds at an accuracy of the slave oscillator.

However, with respect to the frequency drift (FD) immediately prior to fault generation, there is an initial frequency offset (IO) depending on the set resolution (bit width) of the D/A converter 5 or direct digital synthesizer 8, as described hereinabove.

Explaining it by a simple example, in FIG. 1, when the bit width of the D/A converter 5 is 3 bit, the output voltage width is 1 V, and the frequency variable characteristic of the voltage control oscillator (VCO) 6 is 1 ppm/V, the set resolution of the frequency will be:

$$\frac{1V}{2^3} \times \frac{1\,\text{ppm}}{V} = 0.125\,\text{ppm}(/\text{bit})$$

Therefore, the worst possible value $$0.125 \times \frac{1}{2} \Rightarrow \pm 6.25 \times 10^{-8}$$

has to be anticipated as the initial frequency offset during the holdover.

Generally, even in the case of a large number of bit widths, for the D/A converter 5, it is 16 bit, for the direct digital synthesizer 8 it is about 32 bit, and a critical set resolution for frequency is about $1 \times 10^{-9}$.

In North America Bellcore Specification GR-1244, a high accuracy of $\pm 1 \times 10^{-9}$ and $\pm 1 \times 10^{-10}$ is required for stratum 3E and stratum 2, respectively.

Therefore, as shown in FIG. 1 and FIG. 3, with the method of fixing the control value, the aforementioned specification is extremely difficult or impossible to realize.

With the foregoing in view, it is an object of the present invention to provide a DPLL circuit making it possible to inhibit the initial frequency offset during the holdover.

In order to attain the above-described object, the first aspect of the present invention provides a digital PLL circuit for generating an internal clock that is phase synchronized with a reference clock of a digital synchronization network, comprising a slave oscillator for generating a frequency signal corresponding to the size of a control signal value, a phase difference detection circuit for detecting the difference in phase between the output of the slave oscillator and the inputted reference clock, and outputting a digital signal of the prescribed number of bits corresponding to the detected phase difference, and a holdover unit for generating a correction value based on the output of the phase difference detection circuit, wherein when the holdover is detected, the holdover unit periodically adds the correction value to the output of the phase difference detection circuit to obtain a control value for the slave oscillator.

In order to attain the above-described object, the second aspect of the present invention provides a digital PLL circuit according to the first aspect, wherein the holdover unit comprises a circuit for separating upper N bits and lower M bits with respect to the digital signal of the prescribed number of bits that is outputted from the phase difference detection circuit, a period conversion circuit for setting an addition period corresponding to the value of the separated lower M bits, a correction value output circuit for outputting the prescribed addition value with the prescribed period, and an addition circuit for adding the addition value from the correction value output circuit to the value of the separated upper N bits within the interval of the addition period set by the period conversion circuit, and during the holdover, the output of the addition circuit is taken as the control signal value of the slave oscillator.

In order to attain the above-described object, the third aspect of the present invention provides a digital PLL circuit according to the first aspect, further comprising a selector for inputting the output of the phase difference detection circuit and the output of the holdover unit as the input, and selecting and outputting only one of them, and during the holdover, the output of the holdover unit is selected and outputted.

In order to attain the above-described object, the fourth aspect of the present invention provides a digital PLL circuit for generating an internal clock that is phase synchronized with a reference clock of a digital synchronization network, comprising a slave oscillator for generating a frequency signal corresponding to the size of a control signal value, a phase difference detection circuit for detecting the difference in phase between the output of the slave oscillator and the inputted reference clock, and outputting a digital signal of the prescribed number of bits corresponding to the detected phase difference, a first memory for storing the history of control values for the slave oscillator, an average value circuit for finding an average value of the history of the control values stored in the memory, a rounding circuit for rounding the output of the average value circuit to upper N bits, and a circuit for finding an oscillation characteristic of the slave oscillator during the holdover from the output of the average value circuit, and generating an analog correction value providing a characteristic inverted with respect to the oscillation characteristics, wherein the analog correction value is taken as a control value of the slave oscillator.

In order to attain the above-described object, the fifth aspect of the present invention provides a digital PLL circuit for generating an internal clock that is phase synchronized with a reference clock of a digital synchronization network, comprising a slave oscillator for generating a frequency signal corresponding to the size of a control signal value, a phase difference detection circuit for detecting the difference in phase between the output of the slave oscillator and the inputted reference clock, and outputting a digital signal of the prescribed number of bits corresponding to the detected phase difference, a first memory for storing the history of control values for the slave oscillator, an average value circuit for finding an average value of the history of the control values stored in the memory, a rounding circuit for rounding the output of the average value circuit to upper N bits and truncating lower M bits, a counter, a count value judgment circuit for setting a threshold of the count value of the counter correspondingly to the size of the lower M bits truncated in the rounding circuit, and outputting an energizing signal when the count value of the counter exceeds the set threshold, a correction value generation circuit for outputting a prescribed correction value when the energizing signal is outputted from the count value judgment circuit, an addition circuit for adding the output of the correction value generation circuit to the upper N bits from the rounding circuit, and a selector for outputting the output of the addition circuit as a control value of the slave generator during the holdover.

In order to attain the above-described object, the sixth aspect of the present invention provides a digital PLL circuit according to the fifth aspect, further comprising a second memory for storing the history of control values for the slave oscillator, which is longer that that of the first memory, a circuit for finding the oscillation characteristic of the slave oscillator during the holdover from the output of the second memory, a correction value conversion circuit for generating a correction value providing a characteristic inverted with respect to the found oscillation characteristics of the slave oscillator, and an adder for adding the output of the correction value conversion circuit to the upper N bits from the rounding circuit.

Specific features of the present invention will be further clarified based on embodiments thereof that will be explained with reference to the appended drawings.

DESCRIPTION OF THE PREFERRED EMBODIMENTS

The embodiments of the present invention will be described with reference to the appended drawings. The embodiments are merely for explaining the present invention and the technological scope of the present invention is not limited thereto.

Figure 1:
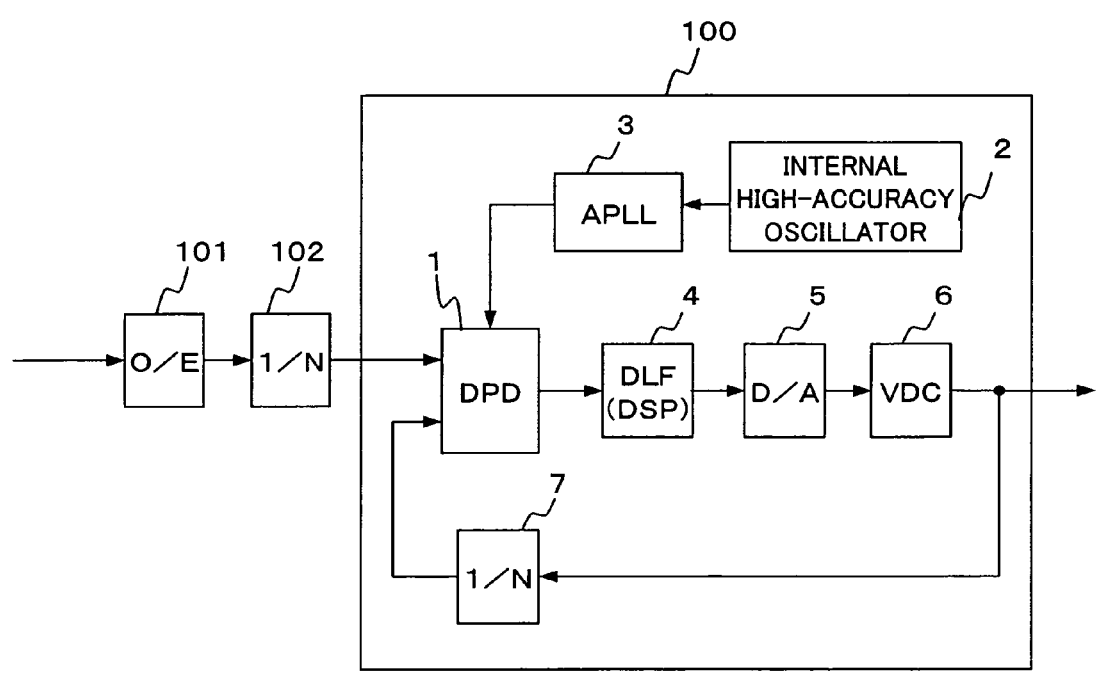
FIG. 1 is a block diagram illustrating the general configuration example of a DPLL circuit.
Figure 2:
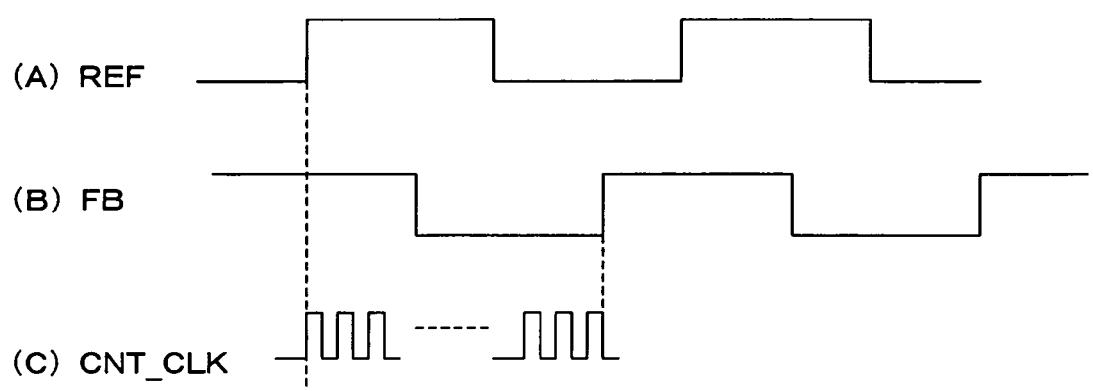
FIG. 2 illustrates a comparison operation of a digital phase comparator (DPD) 1.
Figure 3:
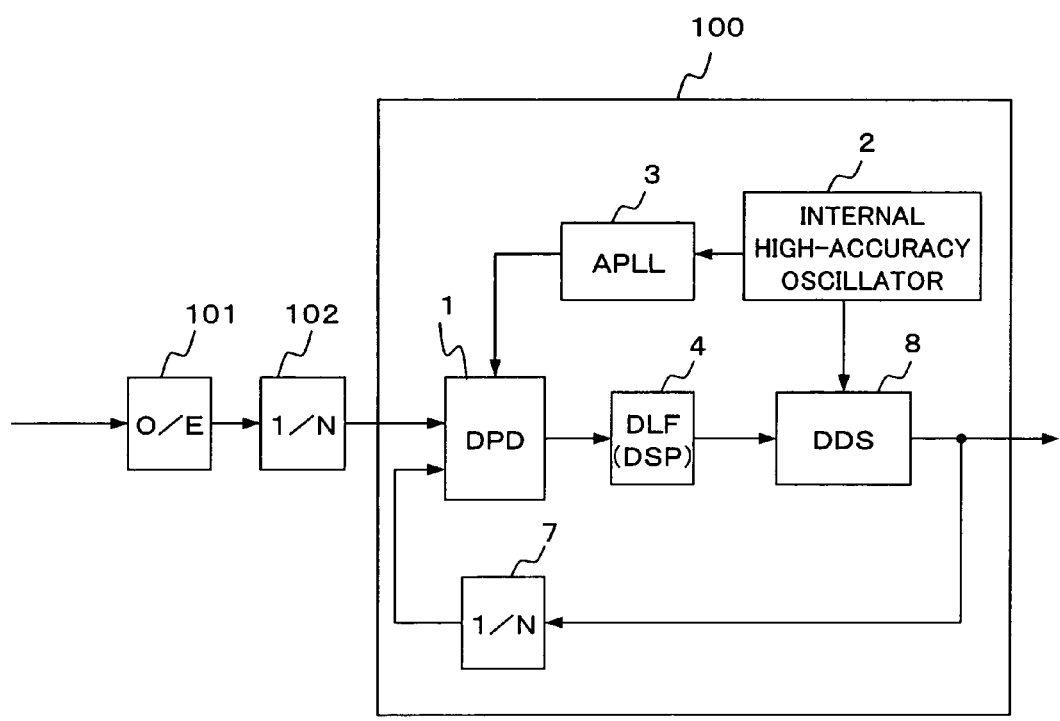
FIG. 3 relates to the case where a direct digital synthesizer (DDS) is used for a slave oscillator.
Figure 4:
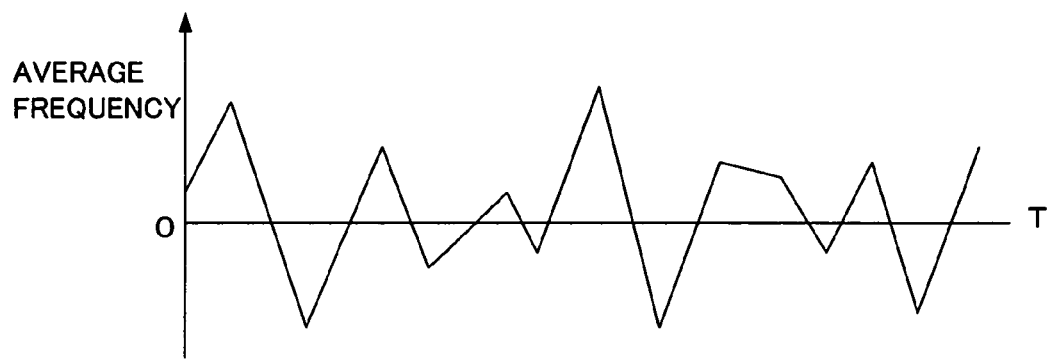
FIG. 4 illustrates the average frequency drift.
Figure 6:
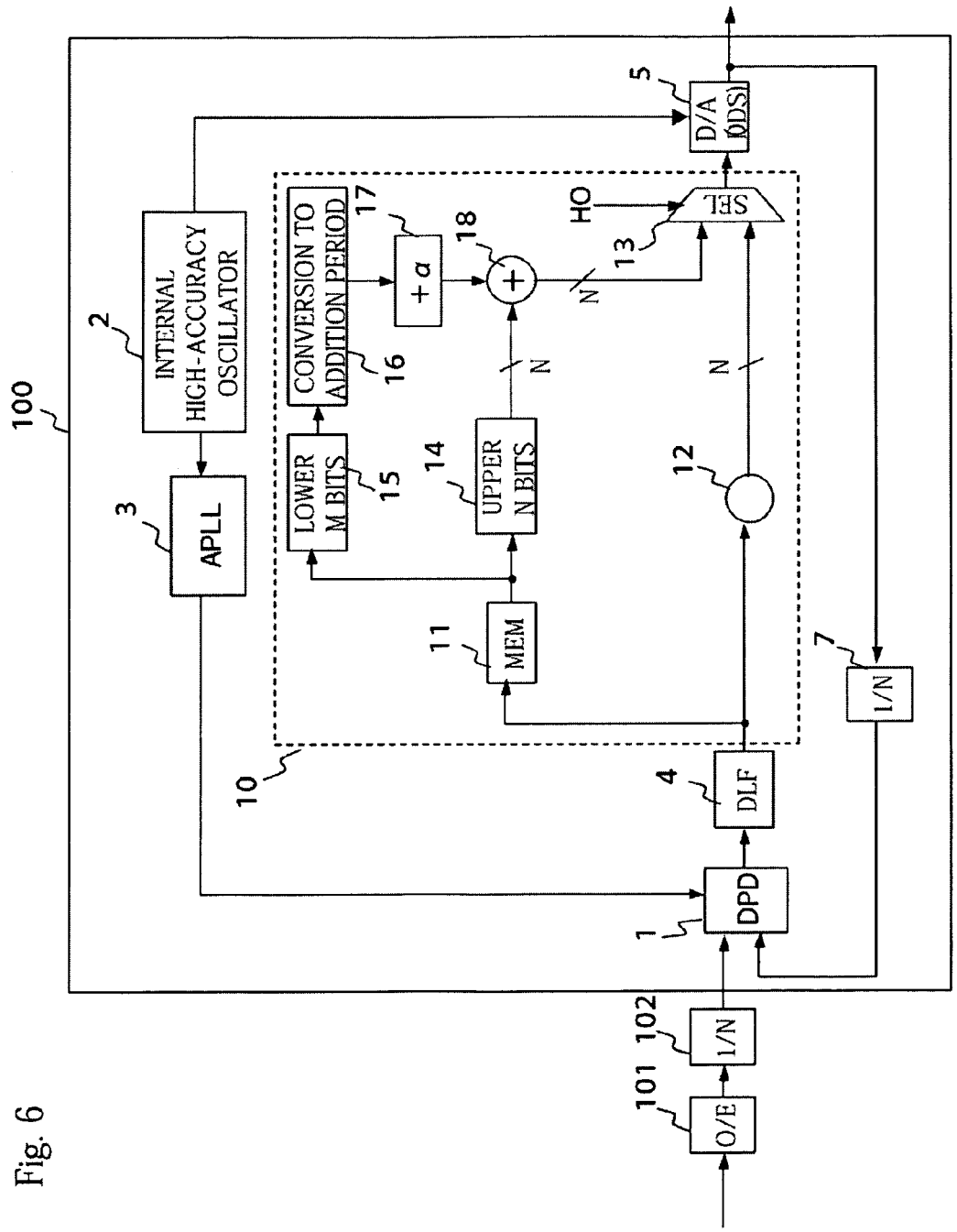
FIG. 6 is a block diagram of the first embodiment of the digital PLL circuit in accordance with the present invention.

FIG. 6 is a block diagram of the first Embodiment of the digital PLL circuit of the present invention. In the embodiment shown in FIG. 6, functional components identical or analogous to those of the conventional example shown in FIG. 1 and FIG. 2 are assigned with the same reference numerals. Further, the embodiment is explained below commonly with respect to two cases where a voltage control oscillator 6 and direct digital synthesizer 8 are used as a slave oscillator.

The specific feature of the present invention is in the presence of a holdover circuit 10. A selector 13 in the holdover circuit 10 has a function of switching the input with a holdover detection signal HO if the interruption of the reference clock that is detected in the apparatus or the interruption of the input frequency signal is detected.

Therefore, in the usual state the input of a rounding circuit 12 (rounding to the nearest whole number) for rounding the output of a digital loop filter (DLF) 4 to N bit is effectively outputted.

On the other hand, in the holdover circuit 10 with the selector 13, when synchronization is conducted with the reference clock, the output of the digital loop filter (DLF) 4 is stored in a memory 11 having a circular buffer function of superscribing outside of the old data if the memory capacity is full and outputted after rounding (rounding to the nearest whole number) with the rounding circuit 12 conducted to match the bit width N of a D/A converter 5 and the voltage control oscillator 5 (or direct digital synthesizer 8).

Then, during the holdover, of the output value of the digital loop filter 4 prior to rounding that was stored in the memory 11 to provide for the holdover, the upper N bits matched with the bit width of the D/A converter 5 (or direct digital synthesizer 8) and the lower M bits (any bit width) for the correction value are separated and acquired with respective separation circuits 14, 15.

If the lower M bits are inputted from the separation circuit 15 designated for the lower M bits, a period conversion circuit 16 outputs a correction period timing signal with a period corresponding to the size of the value of the lower M bits.

Figure 7:
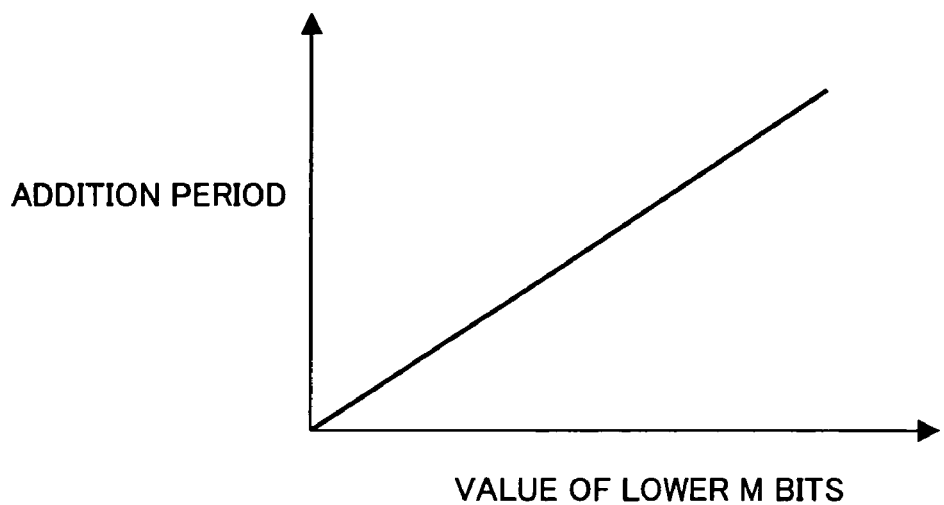
FIG. 7 illustrates the relationship between the size of the value of the lower M bits and the addition period for outputting the correction period timing signal from the period conversion circuit 16.

FIG. 7 shows the relationship between the size of the value of the lower M bits and the addition period of outputting a correction period timing signal from the period conversion circuit 16. As shown in FIG. 7, the larger is the value of the lower M bits, the larger is the addition period.

Figure 5:
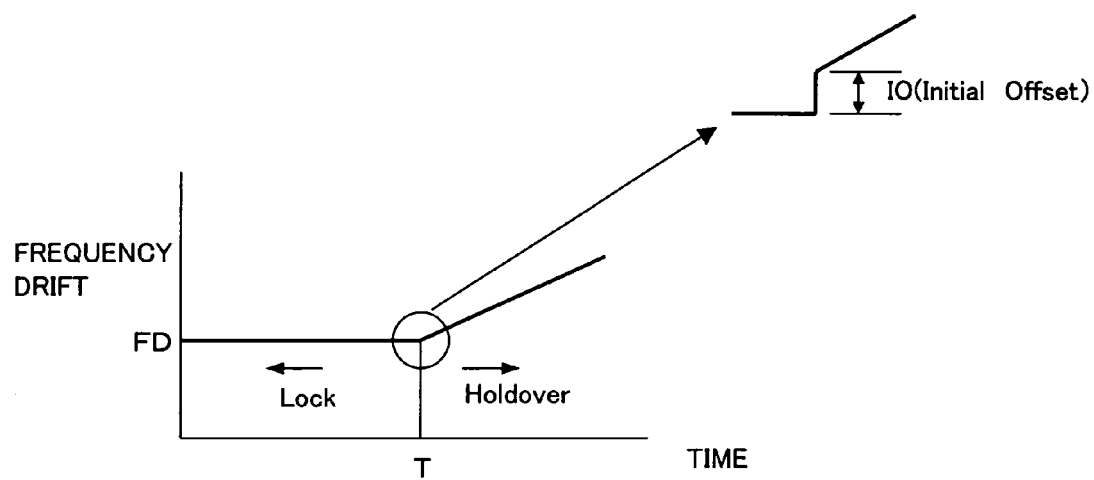
FIG. 5 illustrates the state of frequency drift during the holdover.

Thus, as shown in FIG. 5, the size of the initial frequency offset (IO) during the holdover appears as the resolution of the D/A converter 5 (or direct digital synthesizer 8). Therefore, the addition period corresponding to the size of the value of the lower M bits is found in the above-described manner from the period conversion circuit 16 and a timing signal is outputted with the prescribed period within the correction period interval.

The correction value (+α) output circuit 17 outputs the correction value (+α) for each timing signal of the prescribed period outputted within the correction period interval and inputs it into an addition circuit 18.

The addition circuit 18 adds the correction value (+α) to the output of the upper bit separation circuit 14 in the correction period timing, rounds up to N bits, and outputs.

The initial frequency offset during the holdover can be corrected, as shown in FIG. 5, with this correction value. Furthermore, changing the prescribed period of adding the correction value (+α) makes it possible to control finely the offset value, and the setting resolution is increased by a factor of $2^M$ correspondingly to the width of the lower M bits.

Figure 8:
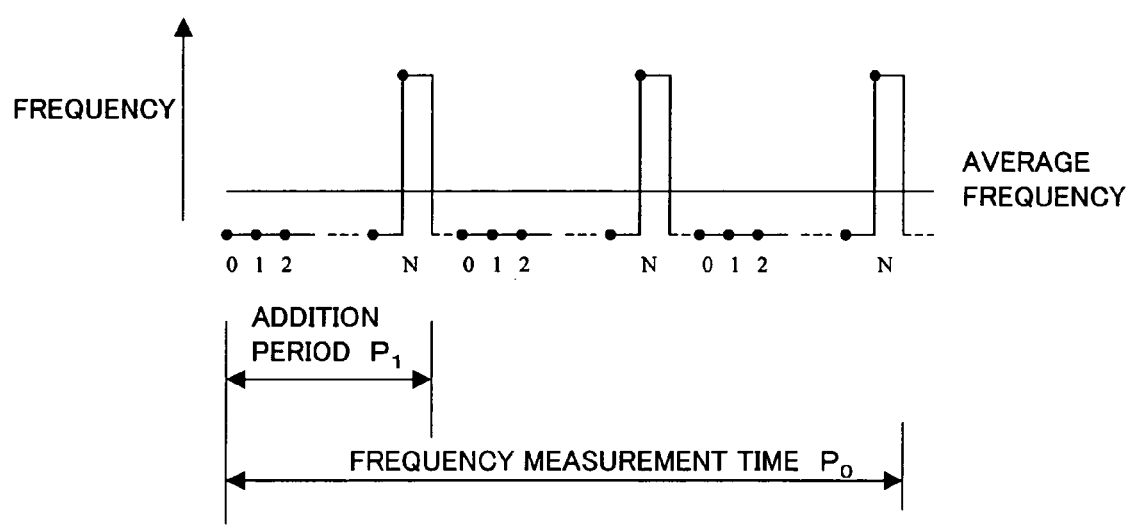
FIG. 8 illustrates the average frequency of the output frequency in the slave oscillator.

Here, the output frequency of the voltage control oscillator 6 (or direct digital synthesizer 8) can be found, for example, as an average value for 1 sec as a constant frequency measurement time (gate time) $P_o$. Thus, as shown in FIG. 8, the average frequency is found from an output frequency in the slave oscillator obtained for each of a plurality of addition periods $P_1$ in the frequency measurement time $P_o$. In accordance with the present invention, the size of the upper M bit is set and the average frequency during the holdover transition can be made conforming to the accuracy stipulated by the above-described North America—Bellcore Specification GR-1244.

Figure 9:
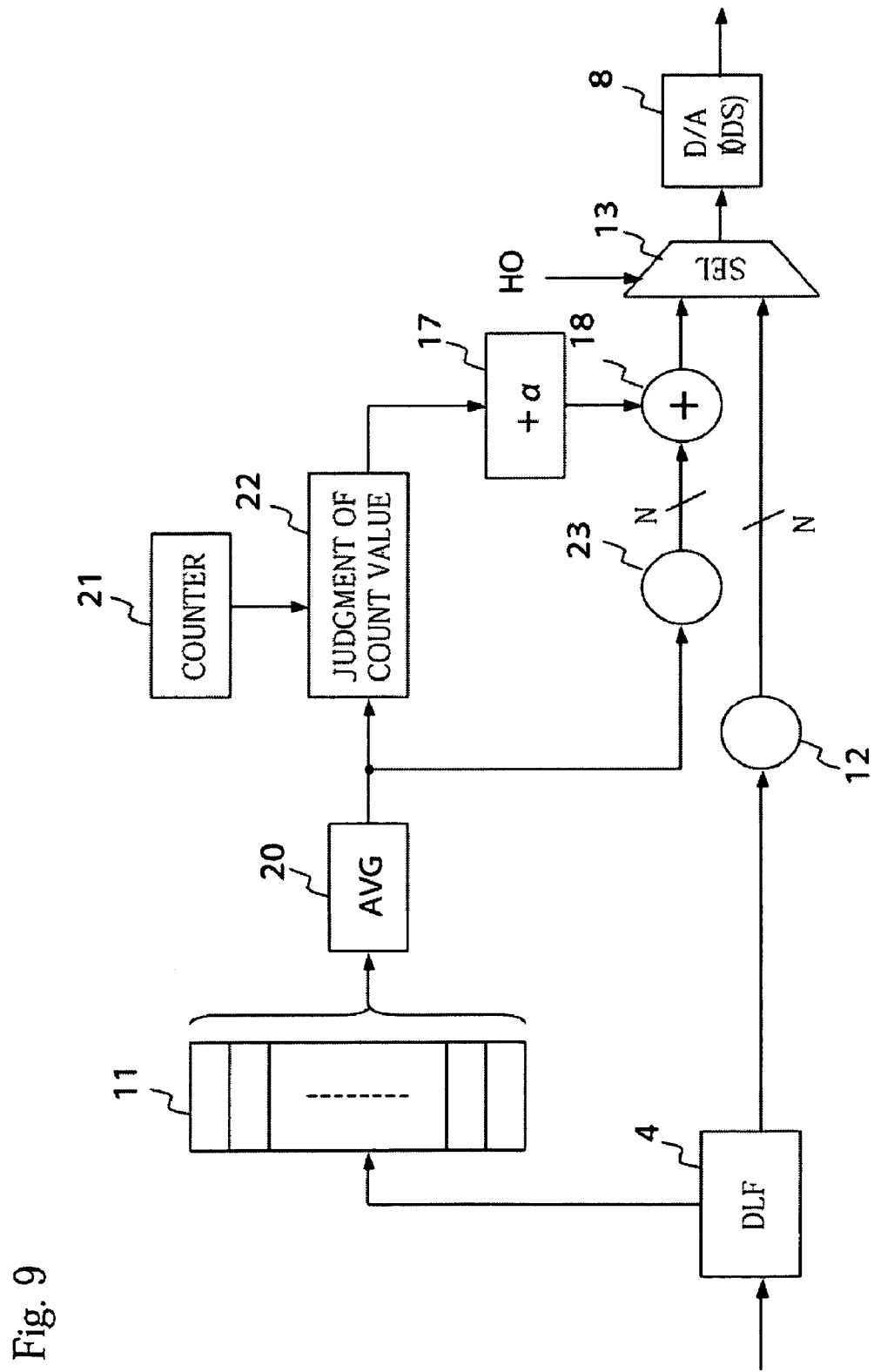
FIG. 9 is a block diagram illustrating the second embodiment of the present invention.

FIG. 9 is a block diagram illustrating the second embodiment of the present invention. In the present embodiment, only the structural portion of the holdover unit 10, which is a specific feature of the present invention, is shown in the figure. The components identical or analogous to those of the above-described embodiment are assigned with the same reference numerals.

Referring to FIG. 9, the output of the digital loop filter (DLF) 4 during synchronization with the reference clock is accumulated in an internal memory 11 of a digital signal processor (DSP). This memory 11 is a circular buffer and superscribes outside of the old data if the memory capacity is full.

The average value computation circuit 20 computes the average value of the data accumulated in the memory 11 when a reference clock failure is generated. The output of the average value computation circuit 20 is rounded to the upper N bit (rounding to the nearest whole number) with the rounding circuit 23 and inputted into an adder 18.

At the same time, the output of the average value computation circuit 20 is inputted into a count value judgment circuit 22. The count value judgment circuit 22 determines a judgment threshold corresponding to the value of the lower M bits of the average value truncated in the rounding circuit 23. When the counter value of the counter 21 exceeds the determined threshold, a "1" signal is outputted from the count value judgment circuit 22 and the correction value output circuit 17 is activated.

If the correction value output circuit 17 inputs the "1" signal from the count value judgment circuit 22, it outputs a correction value (+α). The correction value (+α) is added by the adder 18 to the output of the rounding circuit 23 and inputted into the selector 13.

The selector 13 is switch controlled by the holdover information OH and selects and outputs the output of the adder 18 when it detects that the reference clock detected in the apparatus is interrupted or that the input frequency signal is interrupted.

As a result, in the second embodiment, too, during the holdover transition, the accuracy stipulated by the above-described North America—Bellcore Specification GR-1244 can be conformed to with respect to the average frequency found with the average value computation circuit 20.

Figure 10:
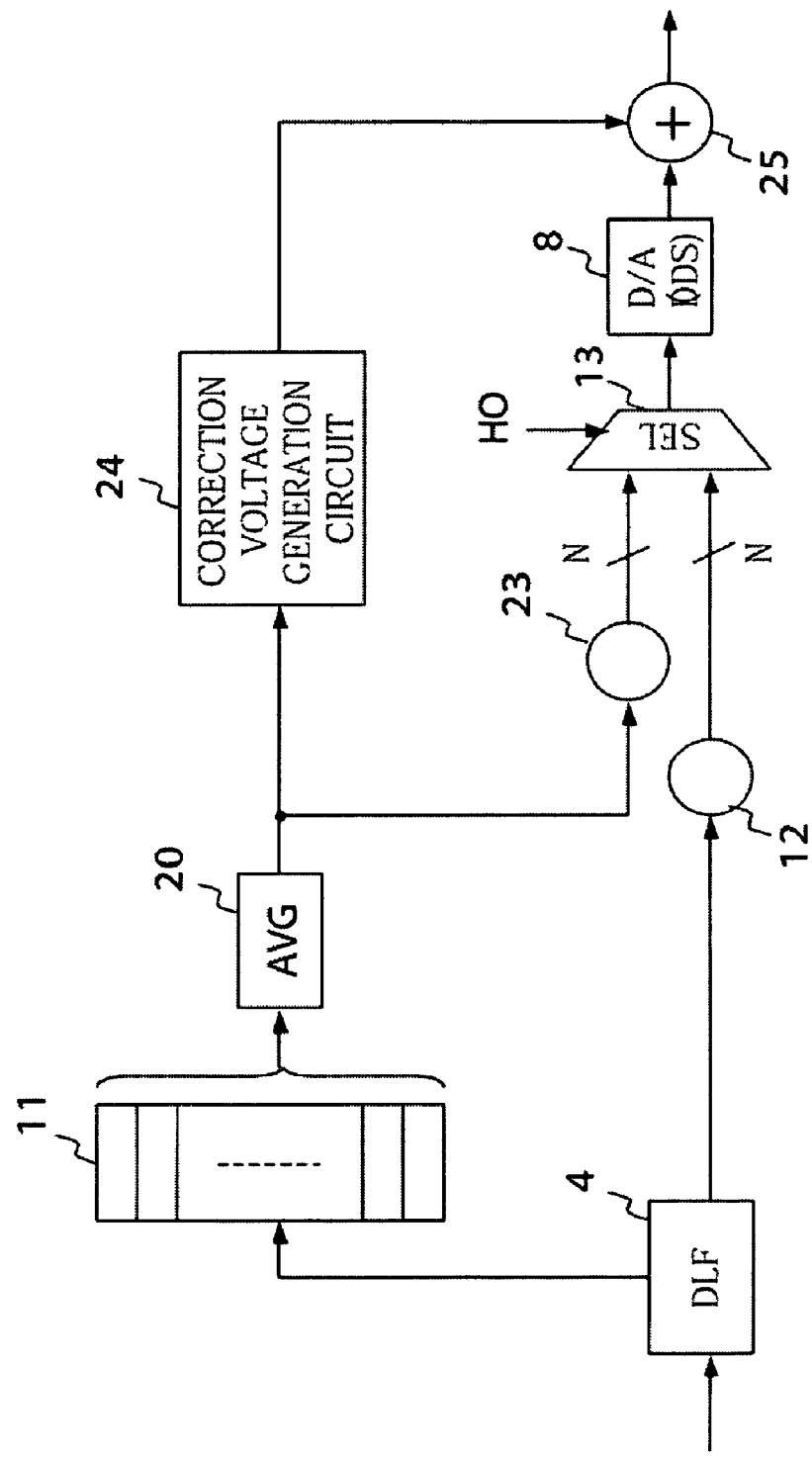
FIG. 10 is a block diagram illustrating the third embodiment of the present invention.

FIG. 10 is a block diagram illustrating the third embodiment of the present invention. This embodiment is a modification example of the second embodiment.

Thus, instead of the counter 21, count value judgment circuit 22, and correction value output circuit 17 in the embodiment with reference to FIG. 9, the correction value is outputted in an analog form by the correction voltage generation circuit 24. Therefore, the analog correction voltage is added with the analog adder 25 to the output of the D/A converter 5 (or direct digital synthesizer 8).

In the third embodiment, too, during the holdover transition, the accuracy stipulated by the above-described North America—Bellcore Specification GR-1244 can be conformed to by the generation of the analog correction value.

Figure 11:
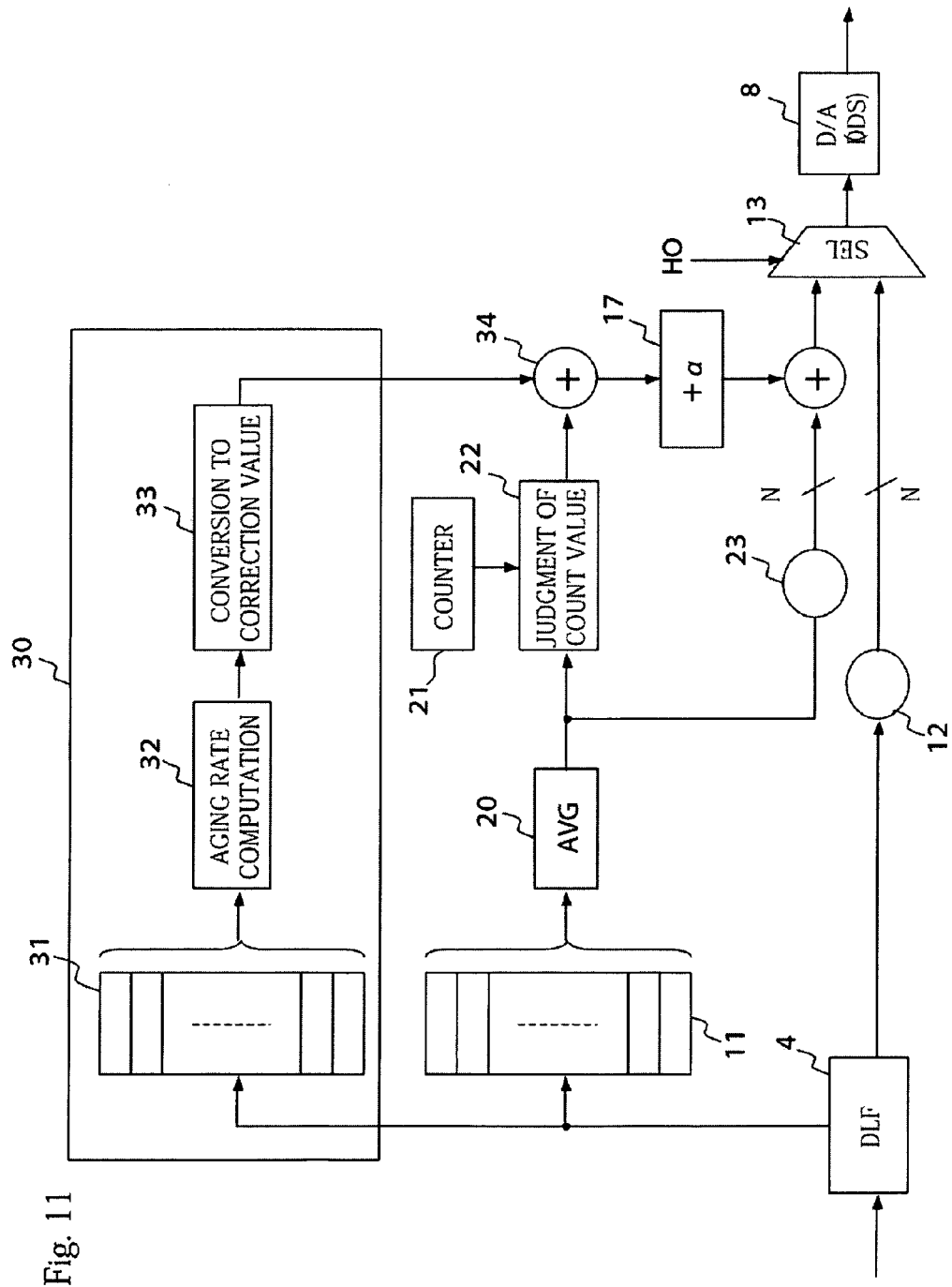
FIG. 11 is a block diagram illustrating yet another embodiment of the present invention.

FIG. 11 is a block diagram of yet another embodiment of the present invention. The specific feature of this embodiment is that the configuration of the embodiment explained with reference to FIG. 9 additionally comprises a circuit 30 for generating the correction signal for an error induced by long-term aging of the slave oscillator, that is, a voltage control oscillator 6 or direct digital synthesizer 8.

Long-term history data is stored in the second memory 31 of a circular buffer type. During the holdover, the history data is read from the memory 31 and a long-term aging rate accompanying changes in the slave oscillator with time is calculated in the aging rate computation circuit 32. Here, the aging rate means the slope of frequency drift changes that varies due to self-induced shift of the slave oscillator from the state shown in FIG. 5 in which the holdover was attained.

Therefore, the correction value conversion circuit 33 generates a polarity signal producing changes in the reverse direction with respect to the slope of frequency drift changes and that signal is added by the adder 34. As a result, the long-term aging rate can be cancelled.

As explained based on the embodiments, the present invention makes it possible to inhibit the initial frequency offset during a holdover. Therefore, the required specification conditions can be easily satisfied and the DPLL circuit in accordance with the present invention can be employed in synchronization network systems.

What is claimed is:

1. A digital PLL circuit for generating an internal clock that is phase synchronized with a reference clock of a digital synchronization network, comprising:
    a slave oscillator to generate a frequency signal corresponding to the size of a control signal value;
    a phase difference detection circuit to detect the difference in phase between the output of said slave oscillator and the inputted reference clock, and to output a digital signal of the prescribed number of bits corresponding to said detected phase difference;
    a memory to store the history of control values for said slave oscillator;
    an average value circuit to find an average value of the history of the control values stored in said memory;
    a rounding circuit to round the output of said average value circuit to upper N bits; and
    a circuit to find an oscillation characteristic of said slave oscillator during the holdover from the output of said average value circuit, and to generate a correction value providing a characteristic inverted with respect to said oscillation characteristics; and
    an adder circuit to add the correction value with the rounded output from the rounding circuit to be taken as a control value for said slave oscillator.

2. A digital PLL circuit for generating an internal clock that is phase synchronized with a reference clock of a digital synchronization network, comprising
    a slave oscillator to generate a frequency signal corresponding to the size of a control signal value;
    a phase difference detection circuit to detect the difference in phase between the output of said slave oscillator and the inputted reference clock, and to output a digital signal of the prescribed number of bits corresponding to said detected phase difference;
    a first memory to store the history of control values for said slave oscillator;
    an average value circuit to find an average value of the history of the control values stored in said memory;
    a rounding circuit to round the output of said average value circuit to upper N bits and to truncate lower M bits;
    a counter;
    a count value judgment circuit to which the output of the average value circuit is inputted, to set a threshold of the count value of said counter correspondingly to the size of the lower M bits truncated in said rounding circuit, and to output an energizing signal when the count value of said counter exceeds said set threshold;
    a correction value generation circuit to generate a prescribed correction value when said energizing signal is outputted from said count value judgment circuit;
    a first addition circuit to add the prescribed correction value generated by the correction value generation circuit to the upper N bits from said rounding circuit; and
    a selector to output the output of said addition circuit as a control value of said slave oscillator during a holdover.

3. A digital PLL circuit for generating an internal clock that is phase synchronized with a reference clock of a digital synchronization network, comprising a slave oscillator to generate a frequency signal corresponding to the size of a control signal value;

a phase difference detection circuit to detect the difference in phase between the output of said slave oscillator and the inputted reference clock, and to output a digital signal of the prescribed number of bits corresponding to said detected phase difference;

a first memory to store the history of control values for said slave oscillator;

an average value circuit to find an average value of the history of the control values stored in said memory;

a rounding circuit to round the output of said average value circuit to upper N bits and to truncate lower M bits;

a counter;

a count value judgment circuit to which the output of the average value circuit is inputted, to set a threshold of the count value of said counter correspondingly to the size of the lower M bits truncated in said rounding circuit, and to output an energizing signal when the count value of said counter exceeds said set threshold;

a correction value generation circuit to generate a prescribed correction value when said energizing signal is outputted from said count value judgment circuit;

a first addition circuit to add the prescribed correction value generated by the correction value generation circuit to the upper N bits from said rounding circuit;

a selector to output the output of said addition circuit as a control value of said slave oscillator during a holdover;

a second memory to store the history of control values for said slave oscillator, which is longer that that than the history of said first memory;

a circuit to find the oscillation characteristic of said slave oscillator during the holdover from the output of said second memory;

a correction value conversion circuit to generate a correction value providing a characteristic inverted with respect to said found oscillation characteristics of the slave oscillator; and a second addition circuit to add the output of said correction value conversion circuit to the energizing signal from the count value judgment circuit.

* * * * *